United States Patent
Rebello et al.

(10) Patent No.: US 10,020,415 B2
(45) Date of Patent: Jul. 10, 2018

(54) DEVICE INCORPORATING AN OXIDE FILM AND METHOD OF FABRICATING THE SAME

(71) Applicant: NATIONAL UNIVERSITY OF SINGAPORE, Singapore (SG)

(72) Inventors: Alwyn Rebello, Singapore (SG); Adekunle Adeyeye, Singapore (SG)

(73) Assignee: NATIONAL UNIVERSITY OF SINGAPORE, Singapore (SG)

( * ) Notice: Subject to any disclaimer, the term of this patent is extended or adjusted under 35 U.S.C. 154(b) by 0 days.

(21) Appl. No.: 15/399,330

(22) Filed: Jan. 5, 2017

(65) Prior Publication Data

US 2017/0200851 A1    Jul. 13, 2017

(30) Foreign Application Priority Data

Jan. 12, 2016  (SG) ............................ 10201600225V (51) Int. Cl.
  *H01L 45/00* (2006.01)
  *H01L 31/09* (2006.01)
  *H01L 31/18* (2006.01)
  *H01L 31/032* (2006.01)

(52) U.S. Cl.
  CPC ............ *H01L 31/09* (2013.01); *H01L 31/032* (2013.01); *H01L 31/186* (2013.01)

(58) Field of Classification Search
  CPC .............................................. H01L 21/02554
  See application file for complete search history.

(56) References Cited

U.S. PATENT DOCUMENTS

| | | | | |
|---|---|---|---|---|
| 4,265,844 A * | 5/1981 | Yokomizo | ............ | H01C 7/112 252/512 |
| 5,138,298 A * | 8/1992 | Shino | ................. | H01C 7/112 252/519.52 |
| 2011/0164447 A1* | 7/2011 | Arita | ................. | G11C 13/0007 365/148 |
| 2013/0049923 A1* | 2/2013 | Ueda | ................. | H01C 1/148 338/20 |
| 2014/0167909 A1* | 6/2014 | Itami | ................. | H01C 1/148 338/21 |
| 2014/0361229 A1* | 12/2014 | Yamazaki | ............ | H01C 10/00 252/519.52 |
| 2015/0270036 A1* | 9/2015 | Yamazaki | ............ | H01C 7/10 338/20 |
| 2017/0030770 A1* | 2/2017 | Clerici | ................. | G01J 5/024 |

OTHER PUBLICATIONS

Rogalski, A. Infrared detectors: status and trends. Prog. Quant. Electron. 27, 59-210 (2003).

(Continued)

*Primary Examiner* — Thao P Le
(74) *Attorney, Agent, or Firm* — Volpe and Koenig, P.C.

(57) ABSTRACT

A device and a method of forming a device. The method comprises forming an oxide material film; forming two metal electrodes on the oxide material film, the two metal electrodes laterally spaced from each other such that an electric path between the two electrodes comprises at least a portion of the oxide material film; configuring the oxide material film such that a current-voltage characteristic of the device as measured via the two metal electrodes exhibits nonlinearity and rectification.

9 Claims, 6 Drawing Sheets

(56) References Cited

OTHER PUBLICATIONS

Clark, J. & Lanzani, G. Organic photonics for communications. Nature Photon. 4, 438-446 (2010).

Yotter, R. A. & Wilson D. M. A review of photodetectors for sensing light-emitting reporters in biological systems. IEEE Sensors Journal 3, 288-303 (2003).

Wang, X., Tian, W., Liao, M., Bando, Y. & Golberg, D. Recent advances in solution-processed inorganic nanofilm photodetectors. Chem. Soc. Rev. 43, 1400-1422 (2014).

Konstantatos, G., Badioli, M., Gaudreau, L., Osmond, J., Bemechea, M., de Arquer, F. P. G., Gatti, F. & Koppens, F. H. L. Hybrid graphene-quantum dot phototransistors with ultrahigh gain. Nature Nanotech. 7, 363-368 (2012).

Zhang, Y., Liu, T., Meng, B., Li, X., Liang, G., Hu, X. & Wang, Q. J. Broadband high photoresponse from pure monolayer graphene photodetector. Nature Commun. 4, 1811 (2013).

Kind, H., Yan, H., Messer, B., Law, M. & Yang, P. Nanowire Ultraviolet Photodetectors and Optical Switches. Adv. Mater. 14, 158-160 (2002).

Abbasi M. A. Ibupoto, Z. H., Khan, A., Nur, O., & Willander, M. Fabrication of UV photo-detector based on coral reef like p-NiO/n-ZnO nanocomposite structures. Mater. Lett. 108, 149-152 (2013).

Kushwaha, A., & Aslam, M. Defect induced high photocurrent in solution grown vertically aligned ZnO nanowire array films. J. Appl. Phys. 112, 054316 (2012).

Seo, S. et al. Reproducible resistance switching in polycrystalline NiO films. Appl. Phys. Lett. 85, 5655-5657 (2004).

Liang, K., Tang, X. & Hu, W. High-performance three-dimensional nanoporous NiO film as a supercapacitor electrode. J. Mater. Chem. 22, 11062-11067 (2012).

Kadam, L. D. & Patil, P. S. Studies on electrochromic properties of nickel oxide thin films prepared by spray pyrolysis technique. Sol. Energy Mater. Sol. Cells 69, 361-369 (2001).

Maciak, E. & Opilski, Z. Transition metal oxides covered Pd film for optical H2 gas detection. Thin Solid Films 515, 8351-8355 (2007).

Bascholo, O., Hog Feldt, A. & Lindquist, S. E. Dye-Sensitized Nanostructured p-Type Nickel Oxide Film as a Photocathode for a Solar Cell. J. Phys. Chem. B 103, 8940-8943 (1999).

Shima, H. et al. Resistance switching in the metal deficient-type oxides: NiO and CoO. Appl. Phys. Lett. 91, 012901 (2007).

Sawa, A. Resistive switching in transition metal oxides. Mater. Today 11, 28-36 (2008).

Waser, R. & Aono, M. Nanoionics-based resistive switching memories. Nat. Mater. 6, 833-840 (2007).

Kwon, D.-H. et al., Atomic structure of conducting nanofilaments in TiO2 resistive switching memory. Nat. Nanotechnol. 5, 148-153 (2010).

Oka, K., Yanagida, T., Nagashima, K., Tanaka, H. & T. Kawai, Nonvolatile Bipolar Resistive Memory Switching in Single Crystalline NiO Heterostructured Nanowires. J. Am. Chem. Soc. 131, 3434-3435 (2009).

Mikheev, E., Hoskins, B. D., Strukov, D. B. & Stemmer, S. Resistive switching and its suppression in Pt/Nb:SrTiO3 junctions. Nat. Commun. 5, 3990 (2014).

Shin, H., Choi, S.-B., Yu, C.-J. & Kim, J.-Y. Characterization of crystalline structure and morphology of NiO thin films. J. Nanosci. Nanotechnol. 11, 4629-4632 (2011).

Ai, L. et al. Influence of substrate temperature on electrical and optical properties of p-type semitransparent conductive nickel oxide thin films deposited by radio frequency sputtering, Appl. Surf. Sci. 254, 2401-2405 (2008).

Wu, H. & Wang, L.-S. A study of nickel monoxide (NiO), nickel dioxide (ONiO), and Ni(O 2) complex by anion photoelectron spectroscopy. J. Chem. Phys. 107, 16-21 (1997).

Adler, D. & Feinleib J. Electrical and Optical Properties of Narrow-Band Materials Phys. Rev. B 2, 3112-3134 (1970).

Gupta, P., Dutta, T., Mal, S. & Narayan, J. Controlled p-type to n-type conductivity transformation in NiO thin films by ultraviolet irradiation. J. Appl. Phys. 111, 013706 (2012).

Schubert, E. F. Light-emitting diodes. Cambridge University Press, Intro, title page, preface, 27-47, 59-238, 306-331, 346-422 (2006).

Spicer, W. E., Chye, P. W., Garner, C. M., Lindau, I. & Pianella, P. The surface electronic structure of 3-5 compounds and the mechanism of fermi level pinning by oxygen (passivation) and metals (Schottky barriers). Surf. Sci. 86, 763-788 (1979).

Webster, J. (ed.), Wiley encyclopedia of electrical and electronics engineering (John Wiley & Sons, 1999).

Echresh, A. et al. UV photo-detector based on p-NiO thin film/n-ZnO nanorods heterojunction prepared by a simple process. J. Alloys and Compounds 632, 165-171 (2015).

Ye, J. et al. Accessing the transport properties of graphene and its multilayers at high carrier density. Proc. Natl Acad. Sci. USA 108, 13002-13006 (2011).

Kang, Y. et al. Monolithic germanium/silicon avalanche photodiodes with 340 GHz gain-bandwidth product. Nat. Photon. 3, 59-63 (2009).

Qiu, C. H., & Pankove, J. I. Deep levels and persistent photoconductivity in GaN thin film. Appl. Phys. Lett. 70, 1983-1985 (1997).

Li, J. Z., Lin, J. Y., Jiang, H. X. & Khan, M. A. Effects of persistent photoconductivity on the characteristic performance of an AlGaN/GaN heterostructure ultraviolet detector. Appl. Phys. Lett. 72, 2868-2880 (1998).

Klingenstein, M. et al. Photocurrent gain mechanisms in metal-semiconductor-metal photodetectors, Solid State Electron. 37, 333-340 (1994).

Brongersma, M. L., Halas, N. J. & Nordlander, P. Plasmon-induced hot carrier science and technology. Nat. Nanotechnol 10, 25-34 (2015).

* cited by examiner

DEVICE INCORPORATING AN OXIDE FILM AND METHOD OF FABRICATING THE SAME

CROSS-REFERENCE TO RELATED APPLICATION

This application claims the benefit of priority of Singapore Patent Application No. 10201600225V filed on Jan. 12, 2016, the content of which is incorporated herein by reference in its entirety for all purposes.

TECHNICAL FIELD

This invention relates broadly to a device incorporating an oxide material film, and in particular to robust electric-field tunable opto-electrical behavior in Pt—NiO—Pt and Al—NiO—Al planar structures.

BACKGROUND

Inherent defects and variation of stoichiometry strongly modifies the electrical properties of various insulating and semiconducting oxides. For instance, while ideally pure NiO is a Mott insulator, the presence of inherent defects renders NiO a semiconducting behavior. NiO, is a well-known p-type semiconductor with a wide band gap (~3.8 eV), and has been widely investigated for different technological applications including nonvolatile memory devices, super capacitor electrodes, electrochromic devices, gas sensors and photocathodes for solar cells. In particular, capacitor-like metal-NiO-metal structures have attracted tremendous attention in the past decade due to its potential as an ultra-high density and high speed nonvolatile memory based on reproducible electric field induced changes in the resistance of a material, known as resistive switching. Typically, an initial step known as electroformation is employed to the as prepared devices to facilitate resistive switching. Here, electroformation refers to the application of a sufficiently large electric field ($>10^6$ V/cm) to the pristine devices, which creates conducting nanofilaments in the insulating host matrix. Besides capacitor-like structures, electroformation on single crystalline oxide heterostructured nanowires has also been demonstrated to exhibit resistive switching characteristics. However, very little is known about the electrical and opto-electrical properties of NiO films in planar structure.

On the other hand, physics of light and development of new light based technologies have attracted tremendous research interest owing to their fundamental and technological significance. For instance, photodetectors with low dark current, fast response and high sensitivity have wide range of applications such as optoelectronic devices, biomedical imaging, optical communications, quantum information technology and remote sensing. Transition of electrons between different energy levels by light absorption is the fundamental operating mechanism of a photodetector. Among the commercially available photodetectors, photomultiplier tube and avalanche photodiode stand out owing to their high sensitivity and fast response. However, the prominent demerits of these detectors are fragility, cost, and bulkiness. In addition, the requirement of high electric bias, additional supply voltage stabilization circuitry and intricate temperature compensation hampers the integration of these detectors into the current circuit technologies such as complementary metal-oxide semiconductor (CMOS) electronics. As an alternative, extensive efforts are underway to develop photodetectors from 1D nanowires, quantum dots, metal oxide nanorods and heterojunctions made of nanocomposites and oxide thin films. Although heterojunctions made of ZnO nanorods and NiO thin films have been demonstrated to exhibit modest photodetector characteristics because of a very large response time and high dark current, photoresponse properties of NiO thin films in the planar structure are not known to date.

Embodiments of the present invention seek to address one or more of the above-mentioned needs.

SUMMARY

In accordance with a first aspect of the present invention there is provided a device comprising an oxide material film; two metal electrodes formed on the oxide material film, the two metal electrodes laterally spaced from each other such that an electric path between the two electrodes comprises at least a portion of the oxide material film; wherein the oxide material film is configured such that a current-voltage characteristic of the device as measured via the two metal electrodes exhibits nonlinearity and rectification.

In accordance with a second aspect of the present invention there is provided a method of forming a device, the method comprising forming a oxide material film; forming two metal electrodes on the oxide material film, the two metal electrodes laterally spaced from each other such that an electric path between the two electrodes comprises at least a portion of the oxide material film; configuring the oxide material film such that a current-voltage characteristic of the device as measured via the two metal electrodes exhibits nonlinearity and rectification.

BRIEF DESCRIPTION OF THE DRAWINGS

The invention will be better understood with reference to the detailed description when considered in conjunction with the non-limiting examples and the accompanying drawings, in which:

FIG. 1 (A) shows current vs. voltage characteristics of an in-plane Pt—NiO—Pt device according to an example embodiment incorporating an electroformed NiO film, when voltage is swept from 0→+5→−5→0 V in dark (OFF) and under visible light illumination of power, P=3.9 mW. The inset shows the schematic of the device/measurement setup.

FIG. 1 (B) shows ohmic current vs. voltage characteristics of a device incorporating the pristine film.

FIG. 1 (C) shows the XRD pattern of 100 nm thick NiO films for devices according to example embodiments, deposited at 100 W and 200 W of RF sputtering power.

FIG. 1 (D) shows current vs. voltage characteristics of a device according to an example embodiment when voltage is swept from 0→+1→−1→0 V in dark (OFF) and under low power light illumination.

FIG. 3 (A) shows current vs. voltage characteristics of a device according to an example embodiment when voltage is swept from 0→+10→−10→0 V in dark (OFF) illumination.

FIG. 3 (B) shows current vs. voltage characteristics of a device according to an example embodiment when voltage is swept from 0→+10→−10→0 V under 75 μW power of light illumination (ON).

FIG. 3 (C) shows current vs. voltage characteristics of a device according to an example embodiment under different powers of light illumination, the numbers denoting the magnitude of power in milliwatts.

FIG. 3 (D) shows photo current vs. power of illumination of a device according to an example embodiment at ±10 V.

FIG. 4 (A) shows the variation of photocurrent of a device according to an example embodiment when light is switched ON and OFF at regular interval of 25 s at bias voltage +1 V.

FIG. 4 (B) shows the variation of photocurrent of a device according to an example embodiment when light is switched ON and OFF at regular interval of 25 s at bias voltage −1 V.

FIG. 4 (C) shows the variation of photocurrent of a device according to an example embodiment when light is switched ON and OFF at regular interval of 25 s at bias voltage 10 V.

FIG. 4 (D) shows the variation of photocurrent of a device according to an example embodiment when light is switched ON and OFF at regular interval of 25 s at bias voltage −10 V.

FIG. 5 (A) shows the current vs. voltage curve of an as-prepared Al—NiO—Al planar structure.

FIG. 5 (B) shows the current vs. voltage curve of an Al—NiO—Al planar structure after electroformation, according to an example embodiment.

FIG. 5 (C) shows the systematic variation of current-voltage curves in an Al—NiO—Al planar structure according to an example embodiment at different powers P of light illumination.

FIG. 5 (D) shows the magnitude of photo-current as a function of P at ±10 V in an Al—NiO—Al planar structure according to an example embodiment. The lines are guide to the eyes.

DETAILED DESCRIPTION

Example embodiments described herein demonstrate intriguing photoresponse and electrical behavior in electroformed Pt—NiO—Pt planar structures. As used herein, the term "planar structure" is intended to distinguish from a capacitor-like structure and includes structures incorporating an oxide film with two laterally spaced electrodes formed thereon. While the as prepared (also referred herein as "pristine") devices show ohmic electrical behavior and negligible photoresponse, the electroformed devices according to example embodiments exhibit a nonlinear rectification behavior and a remarkable photoresponse at low voltage biases. Advantageously, the devices according to example embodiments show a dramatic change of sign of rectification under light illumination at higher voltage biases. A polarity dependent and robust gain phenomenon is demonstrated in these devices according to example embodiments. The large sensitivity, fast response, simple design and ease of preparation of these planar structures according to example embodiments make them attractive for integration with current circuit technologies and various opto-electrical applications.

A Pt—NiO—Pt device according to an example embodiment in in-plane geometry is electroformed by the application of an electric field of the order of ~$10^4$ V/cm. While the pristine devices show ohmic behavior and negligible photoresponse, the very robust nonlinear rectification behavior and photoresponse, low dark current, low response time and good responsivity at low voltage biases exhibited by devices according to example embodiments preferably constitute essential qualities of a good photodetector and can be easily integrated in to the current CMOS circuit technologies. The change in the sign of rectification at a higher voltage bias under light illumination, superior photoresponse and sensitivity of devices according to example embodiment may be exploited for novel electro-optical devices and photodetection applications.

Figure 1A:
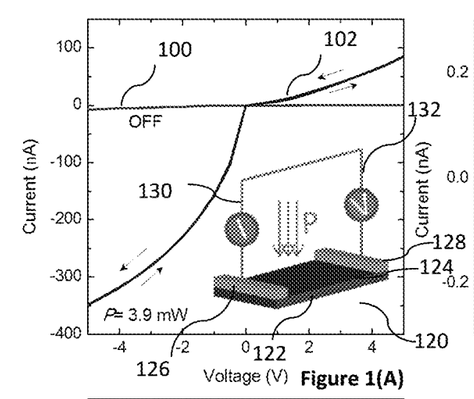
Figure 1B:
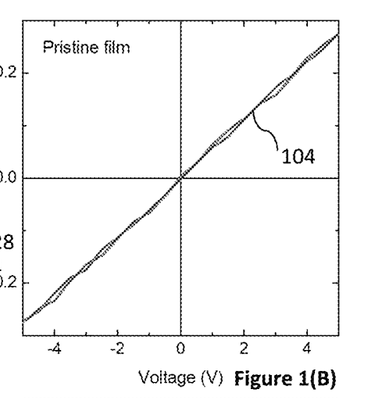

FIG. 1(A) shows the current vs. voltage characteristics of the electroformed Pt—NiO—Pt planar devices according to an example embodiments, incorporating a NiO film, in dark (OFF, curve 100) and under light illumination (P=3.9 mW, curve 102). The current vs. voltage characteristics of the electroformed device according to an example embodiment exhibits nonlinearity and rectification (or diode-like characteristics), both under dark and under light illumination. A large enhancement in the magnitude of the current is observed from very low voltage magnitudes under light illumination. The typical current-voltage curve of an as prepared device, i.e. not electroformed NiO film, is plotted in FIG. 1(B), curve 104. In contrast to the electroformed films (curve 102, FIG. 1(A)), the current-voltage curve 104 of the as prepared film did not show any nonlinearity and rectification.

Figure 1C:
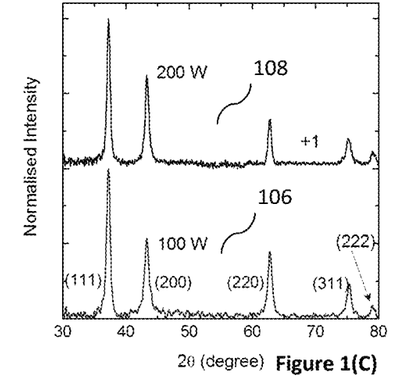

Formation of an unintentional interface layer between metal-oxide interfaces during sample preparation or trapping of charges at the metal-semiconductor interface can lead to non-ohmic behavior. Therefore, the ohmic behavior observed in the present pristine devices (compare curve 104, FIG. 1(B)) indicates that the semiconductor-metal junctions are free of any interfacial capacitance. In addition, it is noted that the films prepared by rf sputtering from direct NiO targets differed in quality from those prepared by dc reactive sputtering from Ni targets. It is known that significant changes occur in the x-ray peak structure and intensity for NiO films grown at different rf powers in dc reactive sputtering using a Ni target. For instance, Shin et al. showed that films deposited at 150 W showed a strong (200) peak compared to the films deposited at 100 W. X-ray measurements were performed on two 100 nm thick NiO films separately deposited at 100 W (spectrum 106) and 200 W (spectrum 108) rf-powers in rf sputtering from direct NiO targets according to example embodiments, as shown in FIG. 1(C). Notably, the x-ray data for the two films are independent of the rf power, which indicates that the quality of the NiO prepared from a direct NiO target according to example embodiments is advantageously less prone to synthesis parameters and significantly differs from that grown using dc reactive sputtering.

Figure 1D:
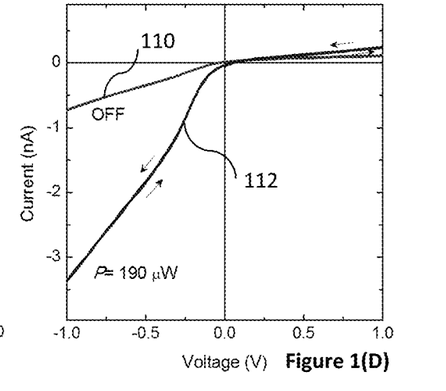

In FIG. 1(D), the current-voltage characteristics of the electroformed device according to an example embodiments at lower voltage magnitudes in dark (curve 110) and under a low power light illumination (P=190 µW, curve 112) are shown. Interestingly, the electroformed device according to an example embodiment exhibits a strong nonlinearity and rectification even at lower voltage magnitudes, which suggests the formation of Schottky barriers at the metal-oxide interfaces. Ohmic contacts between metal-semiconductor junctions are achieved by high doping concentration or low barrier height. The theoretical barrier height for a p-type semiconductor-metal junction is defined as $\varphi_B = E_g/q + \chi - \varphi_m$, where $E_g$ is the band-gap, $\chi$ the electron affinity of the semiconductor and $\varphi_m$ the work function of metal. For NiO—Pt junction, $E_g$~3.8 eV, $\chi$=1.46 eV, $\varphi_{Pt}$=5.4 eV, which yields a low theoretical barrier height ~0.1 eV. Therefore, the non-ohmic nature (compare curve 112, FIG. 1(D)) of the electroformed Pt—NiO—Pt devices according to example embodiments implies either a change in the barrier height or doping concentration induced by electroformation. While pure stoichiometric NiO is a mott insulator, it is generally formed as a p-type semiconductor due to the presence of inherent nickel vacancies, which act as self-dopants. During electroformation according to example embodiments, it is believed that Ni—O bonds can break, followed by the escape of oxygen. This results in a change in the resistance of the device due to the formation of oxygen vacancies and metallic Ni states, which is corroborated by the low resistance of the electroformed devices according to example embodiments compared to the pristine devices (lower by one order of magnitude in the presented data in FIGS. 1(A)-(D)).

Gupta et al. has demonstrated conductivity changes in NiO by laser irradiation-induced non equilibrium concentration of NiO defects. In addition, Kwon et al. have demonstrated that the conducting nanofilaments, formed after electroformation in a $TiO_2$ based RS device, constituted of so-called Magneli phase ($Ti_nO_{2n-1}$), using high resolution transmission electron microscopy. Besides barrier height modification, the presence of random dopants and local variation in chemical composition can cause potential fluctuations, leading to local variation of the semiconductor band edges and bandgap energy fluctuations. Furthermore, in a metal-semiconductor junction with large density of surface states, the barrier height is independent of the metal work function and is determined entirely by the doping and surface properties of the semiconductor. Using photoemission spectroscopy studies, Schottky barriers formed in III-V semiconductors were attributed to the formation of defects near the metal-oxide interface. In the normal case, one anticipates two similar Schottky junctions formed at the oxide metal interfaces, which act like two back to back Schottky diodes, leading to a nonlinear but symmetric behavior as in a metal-semiconductor-metal (MSM) diode. MSM photodetectors generally consist of two Schottky contacts in the form of interdigitated fingers deposited on a low-doped semiconductor.

However, the devices according to example embodiments exhibit an asymmetric nonlinear behavior, plausibly due to the presence of two Schottky junctions, one with a high and the other with a relatively lower potential barrier. Interestingly, similar to a MSM photodetector, the dark current in the devices according to example embodiments is very low (a few picoamperes) under both positive and negative voltage bias polarities. While MSM based photodetectors require a high voltage bias for a reasonable photoresponse, the devices according to example embodiments show remarkable photoresponse at very low magnitude of voltage bias. In addition, the magnitude of photoresponse in the negative bias is larger compared to that in the positive bias (see FIG. 1(A) and FIG. 1(D)).

Figure 2:
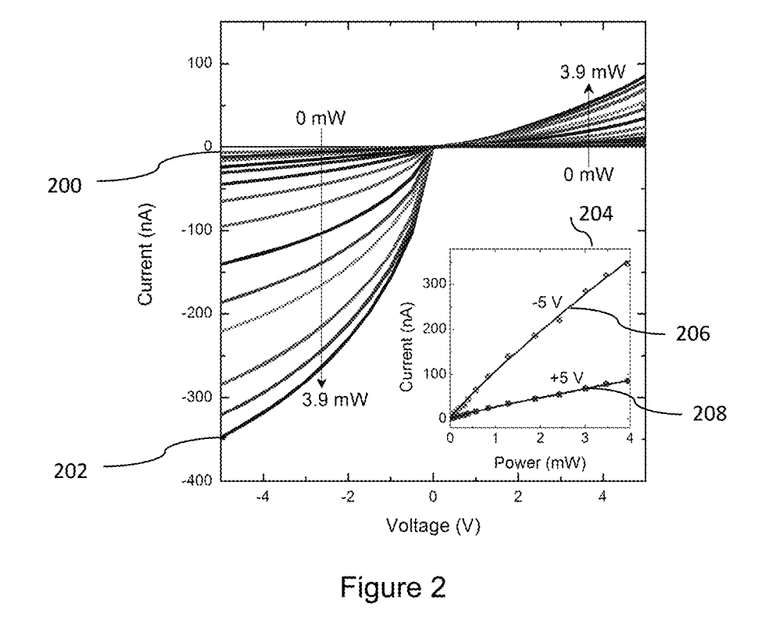
FIG. 2 shows current vs. voltage characteristics (0→5→−5→0 V) of a device according to an example embodiment with increasing power of illumination from 0 to 3.9 mW. The inset shows the variation of photocurrent (I) at ±5 V with increasing power (P) of illumination. Experimental data are denoted by symbols and the lines are power law fit (I~$P^n$).

In FIG. 2 the systematic variation of current vs. voltage curves for a device according to an example embodiment with increasing power of light illumination are shown, when the bias voltage is swept from 0→5→−5→0 V, from 0 (curve 200) to 3.9 mW (curve 202). The photoresponse in the reverse bias is larger compared to the forward bias at all powers of illumination. Interestingly, the curves do not exhibit any hysteresis behavior, which favors practical implementation for device applications. The variation of the magnitude of current (I) at ±5 V is plotted as a function of illumination power (P) in the inset 204. The solid lines 206 (−5 V), 208 (+5 V) are power law ($I \sim P^n$) fits to experimental data (symbols). The fitting gives a non-linear behavior with n=0.85. The non-unity ($0.5<\theta<1$) exponent suggests the presence of traps that have a distribution in energy which favors a complex process of electron-hole generation, recombination, and trapping within the semiconductor. Under electronic doping from light excitation, many trapping states will be converted to recombination states. This increases the number of recombination states for electrons, which, in turn, reduces the electron lifetime and therefore, the value of n deviates from unity.

Figure 3A:
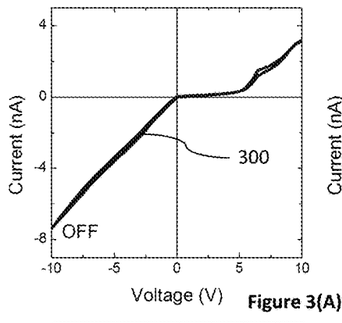
Figure 3B:
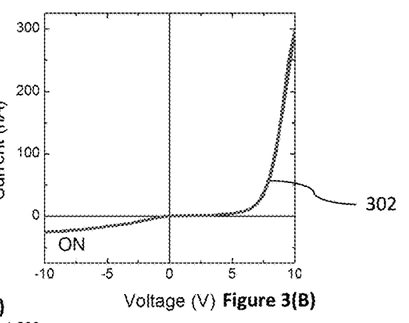
Figure 3C:
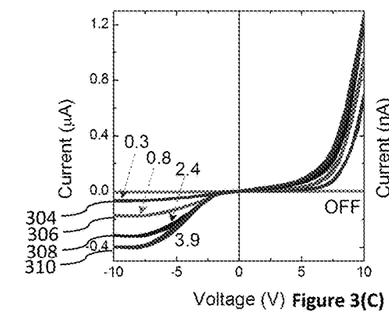
Figure 3D:
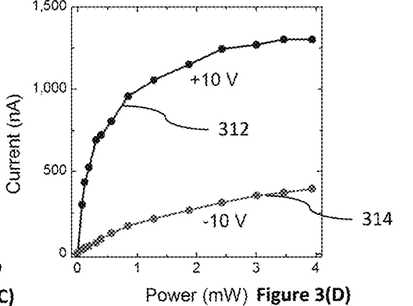

Motivated by the large photoresponse at low bias voltages, the current-voltage characteristics of the device at higher voltage magnitudes was further investigated. FIG. 3(A) shows the current-voltage curve 300 when the voltage is swept from 0→10→−10→0 V under dark ambience and FIG. 3(B) shows the current-voltage curve 302 under a very low power of light illumination P=75 µW. Surprisingly, the magnitude of current under light illumination (curve 302, FIG. 3B) exhibited a large enhancement under positive voltage bias compared to the negative bias, resulting in a dramatic change in the sign of rectification. Note that this is in sharp contrast to the electrical behavior at low voltage magnitudes (compare FIG. 2), where the photoresponse was larger under negative bias. In addition, the current-voltage curves at 0.3 (curve 304), 0.8 (curve 306), 2.4 (curve 308) and 3.9 mW (curve 310) showed a systematic variation under varying power of light illumination, as illustrated in FIG. 3(C), noting that the curves under light illumination were highly reproducible and robust. The variation of the magnitude of current as a function of illumination power at +10 V (curve 312) and −10 V (curve 314) is plotted in FIG. 3(D). In contrast to the photoresponse at low voltage magnitudes (inset 204 of FIG. 2), the photocurrent vs. power for both positive and negative 10 V biases (FIG. 3(D)) could not be fitted to any power law.

Figure 4A:
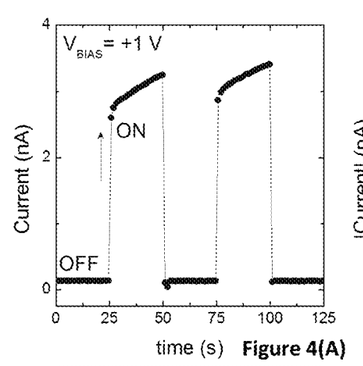
Figure 4B:
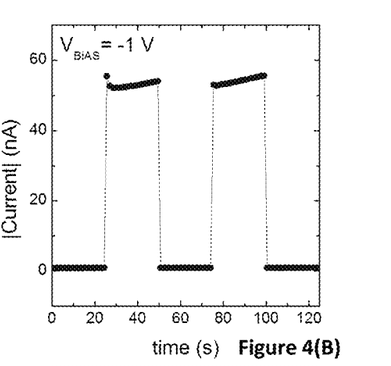
Figure 4C:
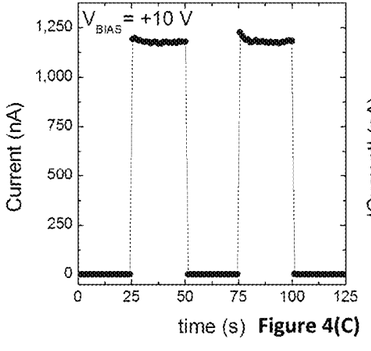
Figure 4D:
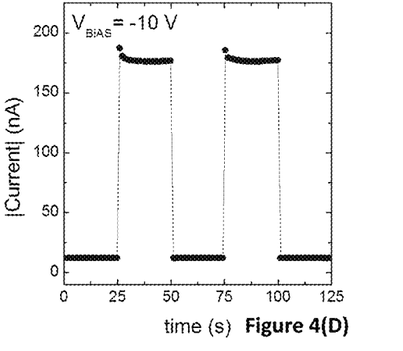

The photoresponse of the device at low (+1 V, FIG. 4(A); −1V, FIG. 4(B)) and high (+10 V, FIG. 4(C); −10V, FIG. 4(D)) voltage biases are shown in FIGS. 4(A)-(D). In all cases, the photocurrent can be reproducibly generated by periodically turning the light illumination on and off. The device according to an example embodiment has a very low dark current (a few nanoamperes) at all voltage biases. Upon illumination, the photocurrent rapidly increased to a stable value, and drastically decreased to its initial level when the light was turned off, indicating the excellent stability and reproducible characteristics of the device according to an example embodiment. In close agreement with the photoresponse of the current-voltage characteristics (see FIG. 3(D)), a large photocurrent of approximately 1100 nA is observed with a very low dark current (a few nanoamperes) for $V_{BIAS}$=+10 V (FIG. 4(B)). Under all the voltage biases, the response time of the device according to an example embodiment was less than the 200 ms, noting that the actual response time could not be measured due to experimental limitations. The above mentioned features render the devices according to example embodiments superior photodetection attributes compared to NiO—ZnO heterojunctions, where the response time is a few tens of seconds with high dark currents. The responsivities of the device according to an example embodiment photodiode obtained using a red laser beam with intensity of illumination I=15 $mW/cm^2$ are 0.24 $AW^{-1}$ (+10 V) and 0.16 $AW^{-1}$ (−1 V). Interestingly a high responsivity of 0.25 $AW^{-1}$ has been demonstrated in an infrared photodetector based on hot electron carrier generation; however the device was cooled down to low temperatures to reduce the presence of high dark current arising from a low potential barrier. At 10 V bias, the devices according to example embodiments showed a large responsivity in the sensitive region (FIG. 3(D)), i.e., at low power of illumination. The responsivity of the device according to an example embodiments is 21.7 $AW^{-1}$ at 10 V and 46 $\mu W/cm^2$ illumination power, which is comparable to the responsivity (3-16 AW$^{-1}$) recently reported in germanium/silicon avalanche photodiodes above 22 V. Furthermore, those latter diodes exhibited a higher dark current, attributed to the tunneling current at the silicon/germanium interface at higher voltage bias.

The devices according to example embodiments exhibited a robust photoconductivity with low dark current levels at these voltage magnitudes (±10V) and did not suffer from any persistent photocurrent problems and degradation of the photoconduction quality by over exposure to light. It is noted that in GaN-based photoconductors, the photocurrent persists for a long time (hours) after the light is shut off and the response speed for the photoconductor is very slow, hampering its implementation in real device applications. The mechanism responsible for the dramatic change of sign of rectification and enhancement in the photocurrent and sensitivity at 10 V may be different from the usual electron-hole generation, recombination, and trapping within the semiconductor. In addition, the photocurrent under light illumination continuously increases with increasing voltage under positive voltage bias above ~5 V, whereas it shows saturation behavior under negative bias (see FIG. 3(C)). In an ideal Schottky junction, the photocurrent shows a saturation when all the carriers generated by the incident photons reach the electrodes before they recombine. Indeed, this scenario can explain the saturation behavior observed under negative voltage bias. Under light illumination at positive bias, the increasing photocurrent with increasing voltage closely resembles the gain phenomena in a MSM photodiode. As mentioned earlier, device according to an example embodiment can be considered as two back to back Schottky junctions, such that one junction will be under forward bias and the other under reverse bias. With increasing voltage, the depletion region of the junction under reverse bias increases and reaches the electrode spacing distance at a particular voltage, called as the flat band voltage of a MSM photodiode. Above this voltage, the electric field in the depletion region nullifies the built in potential at the forward biased junction and the barrier disappears, leading to an enhancement in the photocurrent. The increasing photocurrent with increasing voltage, defined as the gain, can be explained by considering holes or electrons trapped at the surface near electrodes, which creates an asymmetric electric field at the metal-semiconductor contact and induces an additional carrier injection from the electrodes by tunneling. Another plausible scenario is the impact ionization by hot electrons generated at high voltages, similar to an avalanche photodetector.

While the pristine device is unresponsive to the light radiation, the electroformed device in an example embodiment shows strong response to visible light and red laser beam ($\lambda$=650 nm). Since the cut-off wavelength calculated using NiO bandgap (3.6 eV) is $\lambda_c$=hc/$E_g$≈343 nm, it is interesting to note that the electroformed device in an example embodiment shows photoresponse even at higher wavelength.

Figure 5A:
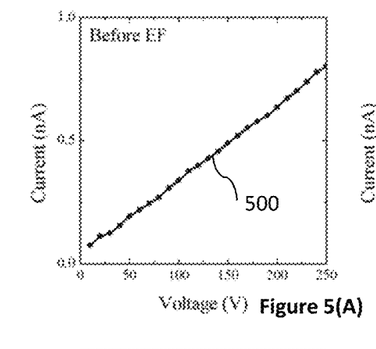

In order the demonstrate the applicability of the present invention to different material systems, FIG. 5(A) shows the current-voltage characteristics (curve 500) of an as-prepared Al—NiO—Al device in the planar structure when voltage is swept from 0→250 V under dark ambience. The current increases almost linearly with increasing voltage and the magnitude of current reaches ~0.8 nA at 250 V.

Figure 5B:
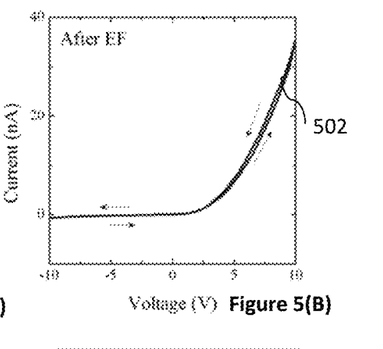
Figure 5C:
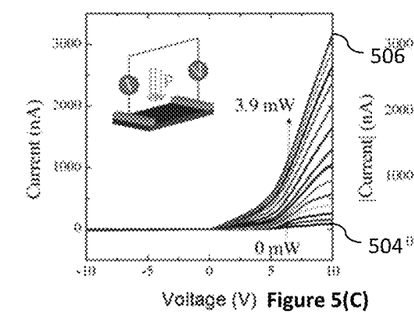
Figure 5D:
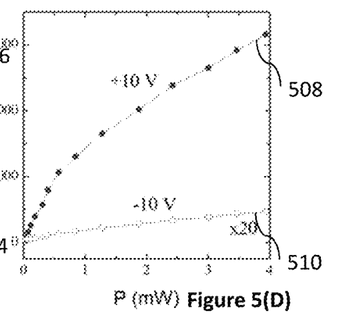

After electroformation, the device according to an example embodiment shows a marked difference in the electrical behavior even at smaller voltage magnitudes. The current voltage characteristic (curve 502) of the electroformed device under dark ambience (OFF state) is shown in FIG. 5(B), wherein the voltage was swept from 0→+10→-10→0 V. The electroformed device according to an example embodiment shows a prominent diode-like rectification behavior with negligible hysteresis, such that the magnitude of current reaches ~35 nA at 10 V under positive voltage bias. In FIG. 5(C), the systematic variation of current vs. voltage curves of the electroformed device according to an example embodiment with different powers of light illumination, P ranging from 0 (curve 504) to 3.9 mW (curve 506). Similar to the OFF state, the current-voltage curves under light illumination are asymmetric and non-linear. Interestingly, the device according to an example embodiment shows a prominent enhancement in the magnitude of current with increasing power of light illumination at higher voltage magnitudes under positive voltage bias. The variation of current as a function of P at +10 V (curve 508) and −10V (curve 510) is shown in FIG. 5(D). While the magnitude of current reaches ~3150 nA under positive voltage bias at P=3.9 mW, it shows a modest value (~23 nA) under negative voltage bias at the same P.

Since electroformation is widely employed in many insulating and semiconducting oxides in the capacitor geometry, it is highly plausible that it may be successfully employed to facilitate photodetector characteristics in planar structures based on wide range of insulating and semiconducting oxides such as $HfO_2$, $MoO_x$, $TiO_2$, $Ta_2O_5$, $Al_2O_3$, $SiO_2$ etc. which are unresponsive to light radiation in the pristine state.

In summary, opto-electrical properties of planar Pt—NiO—Pt and Al—NiO—Al devices in the in-plane geometry have been described above by way of example, not limitation. While the pristine devices show ohmic behavior and negligible photoresponse, the electroformed devices according to example embodiments exhibit a remarkable photoresponse and asymmetric nonlinear electrical characteristics. At lower voltage magnitudes, the devices according to one example embodiment show a larger photoresponse under negative voltage bias compared to that under positive voltage bias. In sharp contrast, at higher voltage bias, the devices according said example embodiment show an excellent sensitivity to light illumination under positive voltage bias, manifested as a dramatic reversal of asymmetry in the electrical characteristics. The ease of fabrication, robustness and the simple design of the devices according to example embodiments facilitate the exploitation of the observed photoresponse behavior and the monolithic integration of these structures with current circuit technologies for a variety of light-based applications, such as optoelectronic devices, biomedical imaging, optical communications, quantum information technology and remote sensing.

Methods of Fabrication of Devices According to Example Embodiments:

Referring back to FIGS. 1(A)-(D), planar Pt—NiO—Pt devices 120 according to example embodiments were prepared on a $SiO_2$/Si substrate 122 using standard photolithography, rf-sputtering and lift-off method. The NiO film 124 (50 nm thickness) was deposited on 150 μm×500 μm area on the substrate 122 at room temperature using a NiO (99.99%) target at an rf power of 100 W, 3×10$^{-3}$ Torr working pressure and in a deposition chamber with a base pressure of less than 3×10$^{-8}$ Torr. Two 200 nm thickness Pt electrodes 126, 128, separated by 200 μm were deposited on the top surface of NiO films 124. A single irreversible electroforming by the application of an electric field of the order of 10$^4$ V/cm was preferred for the devices 120 to show robust photoresponse and nonlinear rectification behavior. For electroformation, a high electrical voltage (400-500 V)

was applied across the metal electrodes 126, 128 for five to eight minutes using two dc probes 130, 132 connected to the high voltage source of a picoammeter (Keithley, 6487). The current-voltage characteristics were measured with two dc probes 130, 132 (on xyz stages) using a picoammeter (Keithley, 6487) in the in-plane geometry. A Bruker X-ray diffractometer in grazing incidence mode was used to confirm the phase of the deposited NiO films 124. The photoresponse measurements were performed using a quartz halogen fiber optic illuminator under dark ambience, as in a black body experiment.

In one embodiment there is provided a device comprising an oxide material film; two metal electrodes formed on the oxide material film, the two metal electrodes laterally spaced from each other such that an electric path between the two electrodes comprises at least a portion of the oxide material film; wherein the oxide material film is configured such that a current-voltage characteristic of the device as measured via the two metal electrodes exhibits nonlinearity and rectification.

The oxide film may be configured as a result of application of an electroforming electric field. The electric field may be of the order of $10^4$ V/cm.

The current-voltage characteristic may exhibit an asymmetric nonlinearity. The asymmetry may change from a larger photoresponse under negative bias voltage to a larger photoresponse under positive bias voltage depending on a magnitude of the bias voltage.

The current-voltage characteristic may exhibit negligible dark current compared to photocurrent under illumination conditions.

The oxide material film may comprise NiO.

The metal electrodes may comprise Pt or Al.

The oxide may be configured such that two back to back Schottky junctions at respective interfaces between the metal contacts and the oxide material film are formed.

Figure 6:
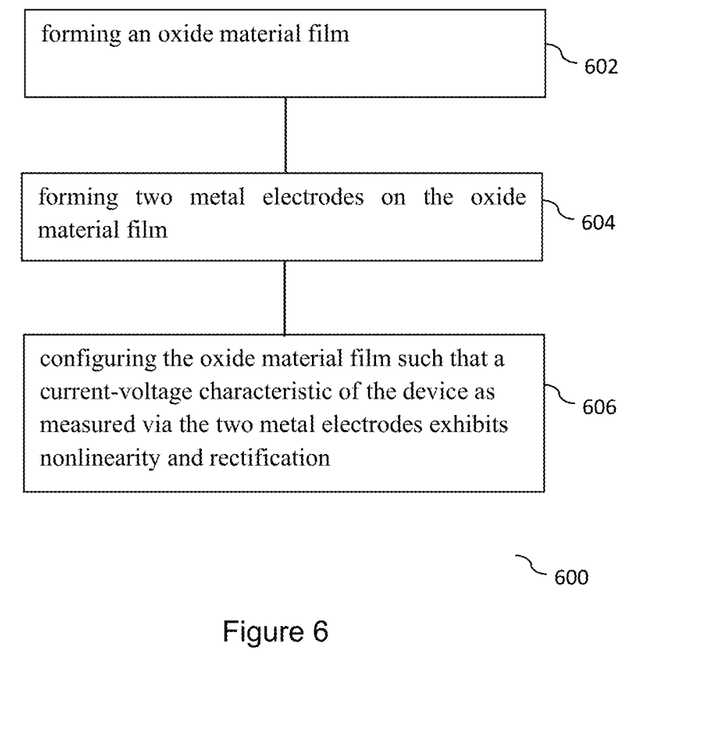
FIG. 6 is a flowchart illustrating a method of forming a device in accordance with the teachings of the invention.

FIG. 6 shows a flowchart 600 illustrating a method of forming a device. At step 602, an oxide material film is formed. At step 604, two metal electrodes are formed on the semiconductor material film, the two metal electrodes laterally spaced from each other such that an electric path between the two electrodes comprises at least a portion of the oxide material film. At step 606, the oxide material film is configured such that a current-voltage characteristic of the device as measured via the two metal electrodes exhibits nonlinearity and rectification.

Configuring the oxide may comprise application of an electroforming electric field. The electric field may be of the order of $10^4$ V/cm.

The current-voltage characteristic may exhibit an asymmetric nonlinearity. The asymmetry may change from a larger photoresponse under negative bias voltage to a larger photoresponse under positive bias voltage depending on a magnitude of the bias voltage.

The current-voltage characteristic may exhibit negligible dark current compared to photocurrent under illumination conditions.

The oxide material film may comprise NiO.

The metal electrodes may comprise Pt or Al.

Configuring the oxide may comprise forming two back to back Schottky junctions at respective interfaces between the metal contacts and the oxide material film.

While the present invention has been particularly shown and described with reference to exemplary embodiments thereof, it will be understood by those of ordinary skill in the art that various changes in form and details may be made therein without departing from the spirit and scope of the present invention as defined by the following claims.

REFERENCES

Seo, S. et al. Reproducible resistance switching in polycrystalline NiO films. Appl. Phys. Lett. 85, 5655-5657 (2004).

Liang, K., Tang, X. & Hu, W. High-performance three-dimensional nanoporous NiO film as a supercapacitor electrode. J. Mater. Chem. 22, 11062-11067 (2012).

Kadam, L. D. & Patil, P. S. Studies on electrochromic properties of nickel oxide thin films prepared by spray pyrolysis technique. Sol. Energy Mater. Sol. Cells 69, 361-369 (2001).

Makiak, F. & Opilaski, Z. Transition metal oxides covered Pd film for optical H2 gas detection. Thin Solid Films 515, 8351-8355 (2007).

Bascholo, O., Hog Feldt, A. & Lindquist, S. E. Dye-Sensitized Nanostructured p-Type Nickel Oxide Film as a Photocathode for a Solar Cell. J. Phys. Chem. B 103, 8940-8943 (1999).

Shima, H. et al. Resistance switching in the metal deficient-type oxides: NiO and CoO. Appl. Phys. Lett. 91, 012901 (2007).

Sawa, A. Resistive switching in transition metal oxides. Mater. Today 11, 28-36 (2008). Waser, R. & Aono, M. Nanoionics-based resistive switching memories. Nat. Mater. 6, 833-840 (2007).

Kwon, D.-H. et al., Atomic structure of conducting nanofilaments in TiO2 resistive switching memory. Nat. Nanotechnol. 5, 148-153 (2010).

Oka, K., Yanagida, T., Nagashima, K., Tanaka, H. & T. Kawai, Nonvolatile Bipolar Resistive Memory Switching in Single Crystalline NiO Heterostructured Nanowires. J. Am. Chem. Soc. 131, 3434-3435 (2009).

Rogalski, A. Infrared detectors: status and trends. Prog. Quant. Electron. 27, 59-210 (2003). Clark, J. & Lanzani, G. Organic photonics for communications. Nature Photon. 4, 438-446 (2010).

Yotter, R. A. & Wilson D. M. A review of photodetectors for sensing light-emitting reporters in biological systems. IEEE Sensors Journal 3, 288-303 (2003).

Wang, X., Tian, W., Liao, M., Bando, Y. & Golberg, D. Recent advances in solution-processed inorganic nano-film photodetectors. Chem. Soc. Rev. 43, 1400-1422 (2014).

Konstantatos, G., Badioli, M Gaudreau, L., Osmond, J., Bernechea, M., de Arguer, F. P. G., Gatti, F. & Koppens, F. H. L. Hybrid graphene-quantum dot phototransistors with ultrahigh gain. Nature Nanotech. 7, 363-368 (2012).

Zhang, Y., Liu, T., Meng, B., Li, X., Liang, G Hu, X. & Wang, Q. J. Broadband high photoresponse from pure monolayer graphene photodetector. Nature Commun. 4, 1811 (2013).

Kind, H., Yan, H., Messer, B., Law, M. & Yang, P. Nanowire Ultraviolet photodetectors and Optical Switches. Adv. Mater. 14, 158-160 (2002).

Abbasi, M. A., Ibupoto, Z. H., Khan, A Nur, O., & Willander, M. Fabrication of UV photo-detector based on coral reef like p-NiO/n-ZnO nanocomposite structures. Mater. Lett. 108, 149-152 (2013).

Kushwaha, A., & Aslam, M. Defect induced high photocurrent in solution grown vertically aligned ZnO nanowire array films. J. Appl. Phys. 112, 054316 (2012).

Mikheev, E., Hoskins, B. D., Strukov, D. B. & Stemmer, S. Resistive switching and its suppression in Pt/Nb:SrTiO3 junctions. Nat. Commun. 5, 3990 (2014).

Shin, H., Choi, S.-B., Yu, C.-J. & Kim, J.-Y. Characterization of crystalline structure and morphology of NiO thin films. J. Nanosci. Nanotechnol. 11, 4629-4632 (2011).

Sze, S. M. & Ng, K. K. Physics of Semiconductor Devices (Wiley, 2007).

Ai, L. et al. Influence of substrate temperature on electrical and optical properties of p-type semitransparent conductive nickel oxide thin films deposited by radio frequency sputtering, Appl. Surf. Sci. 254, 2401-2405 (2008).

Wu, H. & Wang, L.-S. A study of nickel monoxide (NiO), nickel dioxide (ONiO), and Ni(O 2) complex by anion photoelectron spectroscopy. J. Chem. Phys. 107, 16-21 (1997).

Adler, D. & Feinleib J. Electrical and Optical Properties of Narrow-Band Materials Phys. Rev. B 2, 3112-3134 (1970).

Gupta, P Dutta, T., Mal, S. & Narayan, J. Controlled p-type to n-type conductivity transformation in NiO thin films by ultraviolet irradiation. J. Appl. Phys. 111, 013706 (2012).

Schubert, E. F. Light-emitting diodes (Cambridge University Press, 2006).

Spicer, W. E Chye, P. W., Garner, C. M., Lindau, I. & Pianetta, P. The surface electronic structure of 3-5 compounds and the mechanism of fermi level pinning by oxygen (passivation) and metals (Schottky barriers). Surf. Sci. 86, 763-788 (1979).

Webster, J. (ed.), Wiley encyclopedia of electrical and electronics engineering (John Wiley & Sons, 1999).

Rose, A. Concepts in Photoconductivity and Allied Problems (Krieger Publishing Company, 1978).

Echresh, A. et al. UV photo-detector based on p-NiO thin film/n-ZnO nanorods heterojunction prepared by a simple process. J. Alloys and Compounds 632, 165-171 (2015).

Ye, J. et al. Accessing the transport properties of graphene and its multilayers at high carrier density. Proc. Natl Acad. Sci. USA 108, 13002-13006 (2011).

Kang, Y. et al. Monolithic germanium/silicon avalanche photodiodes with 340 GHz gain-bandwidth product. Nat. Photon. 3, 59-63 (2009).

Qiu, C. H & Pankove, J. I. Deep levels and persistent photoconductivity in GaN thin film. Appl. Phys. Lett. 70, 1983-1985 (1997).

Li, J. Z., Lin, J. Y., Jiang, H. X. & Khan, M. A. Effects of persistent photoconductivity on the characteristic performance of an AlGaN/GaN heterostructure ultraviolet detector. Appl. Phys. Lett. 72, 2868-2880 (1998).

Klingenstein, M. et al. Photocurrent gain mechanisms in metal-semiconductor-metal photodetectors, Solid State Electron. 37, 333-340 (1994).

Brongersma, M. L., Halas, N. J. & Nordlander, P. Plasmon-induced hot carrier science and technology. Nat. Nanotechnol. 10, 25-34 (2015).

The invention claimed is:

1. A device comprising:
    an oxide material film; and
    two metal electrodes formed on a top surface of the oxide material film, the two metal electrodes laterally spaced from each other such that an electric path between the two electrodes comprises respective interfaces between the two metal electrodes and the top surface of the oxide material film, and at least a portion of the oxide material film;
    wherein the oxide material film is configured such that a current-voltage characteristic of the device along the electric path as measured via the two metal electrodes exhibits nonlinearity and rectification.

2. The device of claim 1, wherein the oxide material film is configured as a result of application of an electroforming electric field.

3. The device of claim 2, wherein the electric field is of the order of 10$^4$ V/cm.

4. The device of claim 1, wherein the current-voltage characteristic exhibits an asymmetric nonlinearity.

5. The device of claim 4, wherein the asymmetry changes from a larger photoresponse under negative bias voltage to a larger photoresponse under positive bias voltage depending on a magnitude of the bias voltage.

6. The device of claim 1, wherein the current-voltage characteristic exhibits negligible dark current compared to photocurrent under illumination conditions.

7. The device of claim 1, wherein the oxide material film comprises NiO.

8. The device of claim 1, wherein the metal electrodes comprise Pt or Al.

9. The device of claim 1, wherein the oxide is configured such that two back to back Schottky junctions at respective interfaces between the metal contacts and the oxide material film are formed.

* * * * *